(12) United States Patent
Aboushady et al.

(10) Patent No.: US 10,530,385 B2
(45) Date of Patent: Jan. 7, 2020

(54) SIGMA-DELTA MODULATOR

(71) Applicants: SORBONNE UNIVERSITE, Paris (FR); Centre National de la Recherche Scientifique, Paris (FR)

(72) Inventors: Hassan Aboushady, Paris (FR); Tamer Badran, Ivry sur Seine (FR); Alhassan Sayed, Paris (FR)

(73) Assignees: SORBONNE UNIVERSITE, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 16/312,865

(22) PCT Filed: Jun. 22, 2017

(86) PCT No.: PCT/EP2017/065373
§ 371 (c)(1),
(2) Date: Dec. 21, 2018

(87) PCT Pub. No.: WO2017/220720
PCT Pub. Date: Dec. 28, 2017

(65) Prior Publication Data
US 2019/0165803 A1 May 30, 2019

(30) Foreign Application Priority Data

Jun. 23, 2016 (EP) .................................... 16305763

(51) Int. Cl.
*H03M 3/00* (2006.01)
*H04B 1/00* (2006.01)

(52) U.S. Cl.
CPC ............. *H03M 3/43* (2013.01); *H03M 3/396* (2013.01); *H03M 3/402* (2013.01); *H03M 3/424* (2013.01);
(Continued)

(58) Field of Classification Search
CPC ........ H03M 3/43; H03M 3/396; H03M 3/424; H03M 3/402; H04B 1/0014; H04B 1/0021
(Continued)

(56) References Cited

U.S. PATENT DOCUMENTS 9,294,120 B2 * 3/2016 Zhang .................... H03M 3/422
9,577,662 B2 * 2/2017 Wei .......................... H03M 3/37
(Continued)

OTHER PUBLICATIONS

International Search Report issued in Application No. PCT/EP2017/065373, dated Oct. 2, 2017 (5 pages).
(Continued)

*Primary Examiner* — Brian K Young
(74) *Attorney, Agent, or Firm* — Osha Liang LLP

(57) ABSTRACT

A Sigma-Delta ($\Sigma\Delta$) modulator for converting an analog input signal having a frequency bandwidth around a variable center frequency $f_0$ to a digital output signal at a sampling frequency $f_s$. The $\Sigma\Delta$ modulator comprises a quantizer (420) for generating the digital output signal and a loop filter for shaping the quantization noise. The loop filter comprises at least one subfilter (430, 410) centered around a frequency $f_0$ and constant noise shaping coefficients (451, 452, 453). The $\Sigma\Delta$ modulator further comprises a tunable delay element (455), a frequency adjuster (480) for adjusting the sampling frequency $f_s$ such that the normalized center frequency $f_0/f_s$ is constant, and a delay adjuster (490) for adjusting the loop delay $t_d$ implemented by the quantizer and the tunable delay element (455), such that the normalized loop delay $t_d/T_s$ falls in a predetermined range $[t_{min}, t_{max}]$, where $T_s=1/f_s$.

20 Claims, 10 Drawing Sheets

(52) U.S. Cl.
CPC ......... *H04B 1/0014* (2013.01); *H04B 1/0021* (2013.01)

(58) Field of Classification Search
USPC .................................................. 341/143, 155
See application file for complete search history.

(56) References Cited

U.S. PATENT DOCUMENTS 10,243,578 B2 * 3/2019 Dagher ............... H03M 1/1245
2003/0235256 A1 12/2003 Capofreddi

OTHER PUBLICATIONS

Written Opinion issued in International Application No. PCT/EP2017/065373, dated Oct. 2, 2017 (8 pages).
D Bisbal et al.; "A 3-30 MHz Tunable Continuous-Time Bandpass Sigma-Delta A/D Converter for Direct Conversion of Radio Signals"; Nov. 1, 2014; pp. 655-660; https://www.ele.uva.es/~jesus/analog/hfradio.pdf (6 pages).
Yang S et al.; "A Tunable Bandpass Sigma-Delta A/D Conversion for Mobile Communication Receiver"; Poceedings of the Vehicular Technology Conference; Jun. 8, 1994; vol. 2; pp. 1346-1350; XP000497639 (5 pages).
Feng Da et al.; "Polyphase Decomposition for Tunable Band-Pass Sigma-Delta A/D Converters"; IEEE Journal on Emerging and Selected Topics in Circuits and Systems; Dec. 1, 2015; vol. 5, No. 4; pp. 537-547; XP011595137 (11 pages).
Yu Rui et al.; "Bandpass Electromechanical Sigma-Delta Modulator"; Apr. 8, 2010; pp. 68-72; X002633675; https://scholarbank.nus.edu.sg.bitstream/handle/10635/13367/Yu%20Rui%28HT027238H%29_PhD_ECE_Bandpass%20Electromechanical%20Sigma-Delta%20Modulator_2007.pdf?sequence=1 (5 pages).
Akhil Gupta et al.; "A 400 MHz Delta-Sigma Modulator for Bandpass IF Digitization Around 100 MHz with Excess Loop Delay Compensation"; May 15, 2011; pp. 1375-1378; XP031997890 (4 pages).

* cited by examiner

SIGMA-DELTA MODULATOR

TECHNICAL FIELD

The present disclosure relates to a Sigma-Delta modulator, an Analog-to-Digital converter and a method for converting an analog signal to a digital signal using a Sigma-Delta modulator.

BACKGROUND

Sigma-Delta modulators may be used for implementing radiofrequency (RF) receivers in many different types of wireless telecommunication devices. These wireless telecommunication devices may be used for example for several applications such as Software Defined Radio (SDR), Cognitive Radio (CR), Internet of Things (IoT) and Base Stations or cellular phones. These wireless telecommunication devices have for example to comply with different wireless telecommunication standards, including GSM/GPRS, EDGE, UMTS, LTE, Wi-Fi, ZigBee, Bluetooth, etc, and thus have to be able to convert analog input signals having various frequency ranges.

FIG. 1 is a schematic representation of an embodiment of a highly digitized RF receiver 100. The RF receiver 100 comprises an antenna 5, an amplifier 10 (LNA, Low Noise Amplifier), an RF Analog-to-Digital Converter (ADC) 11, a first in-phase branch mixer 12, a first in-phase branch decimation filter 13, a digital signal processor (DSP) 14, an Numerically Controlled Oscillator (NCO) 15, a phase shifter 16 for producing a phase shift of π/2, a second quadrature branch mixer 17, a second quadrature branch decimation filter 18. The NCO 15 generates a sinusoidal signal at center frequency $f_0$ which is used by each of the two mixers 12, 17 for down-converting the output of the ADC 11. In this embodiment, the ADC 11 is close to the antenna 5 and follows directly the LNA 10. In this case, most of the signal processing functions—including down-conversion mixers as well as filtering and channel selection—are implemented in the easily programmable digital domain: it is then easier to reconfigure the RF receiver when switching from one standard to another. This kind of receiver is commonly known as highly digitized SDR receiver.

In this embodiment, the Analog to Digital Converter (ADC) is a Sigma-Delta ADC (referred to herein as ΣΔ ADC). A ΣΔ ADC is a loop circuit that comprises a forward path and a feedback path for generating at least one feedback signal feeding the forward path.

FIG. 2 is a schematic representation of an embodiment of a ΣΔ ADC 200 including a loop with a forward path and a feedback path. The loop comprises a loop filter including one or more subfilters 210, 230 and one or more Digital to Analog Converters (DACs) 251, 252, 253. The forward path comprises a first subfilter 230, a second subfilter 210 and a quantizer 220. The first subfilter 230 is applied to the difference between the analog input signal 201 and the first feedback signal 203 and generates a filtered difference signal 231. The second subfilter 210 is applied to the filtered difference signal 231 generated by the first subfilter 230 and generates a filtered signal 211. The adder 240 generates a difference signal 241 from the filtered signal 211 and the feedback signal 204. The order of the loop filter may be increased by adding more subfilters between the subfilter 210 and the adder 240. The quantizer 220 generates a digital output signal 222 at the sampling frequency $f_s$ from the difference signal 241. Due to the time delay, tq, resulting from the quantizer 220 response-time, the digital output signal 222 is delayed compared to the analog input signal 201. This time delay is usually referred to as the ΣΔ loop delay, $t_d$. The feedback path comprises several DACs 251, 252, 253, for generating respectively the feedback signals 203, 204, 205 feeding the forward path. The coefficients of the DACs 251, 252, 253 are noise shaping coefficients for shaping the quantification noise. While FIG. 2 shows a ΣΔ ADC using feedback noise shaping coefficients, the same principles can be applied to a ΣΔ ADC using feedforward and/or feedback noise shaping coefficients. The noise-shaping coefficients may also be implemented using an FIR-DACs comprising a FIR (Finite Impulse Response) filter.

In order to adapt to the requirements of different wireless communication standards, the ΣΔ ADC should be tunable to be able to process analog input signals that have different bandwidths BW and/or different center frequencies f0. A tunable ΣΔ ADC may be implemented as a low-pass ΣΔ ADC or a band-pass ΣΔ ADC. In a tunable low-pass ΣΔ ADC, the loop filter is a low-pass filter whose bandwidth is tunable. In a tunable band-pass ΣΔ ADC, the loop filter is a band-pass filter whose both the center frequency f0 and the bandwidth are tunable. In both cases, the noise shaping coefficients of the loop filter have to be determined such that the Noise Transfer Function (NTF) of the ΣΔ ADC has a given shape and matches the desired bandwidth BW and/or the desired center frequency f0. See for example the document published 2002, entitled "H. Aboushady and M. M. Louerat, "Systematic Approach for Discrete-Time to Continuous-Time Transformation of Sigma-Delta Modulators", by Aboushady et al, IEEE International Symposium on Circuits and Systems, ISCAS'02, Phoenix Ariz., USA, May 2002."

The performances of this ΣΔ ADC may be improved for example by using either higher order for the loop filter, by increasing the Oversampling Ratio (OSR=$f_s$/2BW) and/or by increasing the number of bits of the quantizer, thus using multi-bit quantizer.

FIGS. 3A-3C illustrate the shape of power spectral density (PSD) of the quantization noise as a function of the frequency for a respective center frequency $f_{01}$, $f_{02}$, $f_{03}$ of the analog input signal. The sampling frequency being noted $f_s$, the frequency range of interest is [0, $f_{s/2}$]. The desired frequency band 300A, 300B, 300C of the analog input signal is assumed to be centered around the respective center frequencies $f_{01}$, $f_{02}$, $f_{03}$. Those curves illustrate the fact, that when the center frequency varies, the shape of the power spectral density (PSD) of the quantization noise also varies. As a consequence, the center frequency of the subfilters of the tunable ΣΔ ADC have to be tuned in order to suppress the quantization noise around the desired center frequency.

In addition, the stability of the tunable ΣΔ ADC at each desired center frequency f0/bandwidth have to be controlled by a proper adjustment of the noise shaping coefficients of the loop filter and of the subfilters.

Example embodiments of a ΣΔ ADC are disclosed for example in patent document U.S. Pat. No. 6,693,573 B1, by Linder et al. In these embodiments, the Micro Electro Mechanical System (MEMS) technology is used, including LC resonators with high quality factor. The center frequency or the tuning range of this ΣΔ ADC may be changed by tuning the capacitance of the LC resonators. The ΣΔ ADC works with a center frequency around 1 GHz-2 GHz.

Another example is described in the document entitled "A DC-to-1 GHz Tunable RF ΣΔ ADC Achieving DR=74 dB and BW=150 MHz at f0=450 MHz using 550 mW" by Shibata et al, IEEE Journal of solid-state circuits, vol. 47, N° 12, December 2012, describes a modulator having a tuning range from 0-to-1 GHz and consuming 750 mW.

The tuning of these ΣΔ ADCs is quite complex and due to this complexity, the tuning range may be limited. Adapting those modulators for higher frequencies would thus imply a higher complexity, higher power consumption and higher size for the ΣΔ ADC circuit. As a consequence, such ΣΔ ADCs could not be used for a wide variety of applications or would not be small enough for being integrated in small and compact wireless telecommunication devices.

There is therefore a need for a simple tunable ΣΔ ADC, of small size and low power consumption suitable for converting analog input signals having various frequency bands.

SUMMARY

According to a first aspect, there is provided a Sigma-Delta (ΣΔ) modulator for converting an analog input signal having a frequency bandwidth around a variable center frequency $f_0$ to a digital output signal at a sampling frequency sampling frequency $f_s$. The ΣΔ modulator comprises a quantizer for generating the digital output signal, and a loop filter for shaping the quantization noise. The loop filter comprises at least one subfilter centered around a frequency $f_0$, and noise shaping coefficients. The noise shaping coefficients are constant and independent of the center frequency $f_0$. The ΣΔ modulator further comprises a tunable delay element; a frequency adjuster for adjusting the sampling frequency $f_s$ such that the normalized center frequency $f_0/f_s$ is constant, and a delay adjuster for adjusting the loop delay ta implemented by the quantizer and the tunable delay element, such that the normalized loop delay $t_d/T_s$ falls in a predetermined range $[t_{min}, t_{max}]$, where $T_s=1/f_s$.

Due to the fixed normalized center frequency, the fixed noise shaping coefficients and the adjustment of the tunable delay element, the stability and the desired noise-shaping of the ΣΔ modulator may be achieved more easily for a wide range of center frequencies.

By varying the sampling frequency, $f_s=1/T_s$ with the center frequency f0, the normalized loop delay td/Ts changes and this alters the Noise Transfer Function (NTF) of the ΣΔ modulator. In order to maintain the same NTF without having to implement a complex tuning for all the coefficients of the loop filter, the Applicant has demonstrated that the loop delay $t_d$ implemented by the quantizer and the tunable delay element may be adjusted so as to compensate for any variation in the normalized loop delay $t_d$/Ts and so as to keep achieving the stability of the ΣΔ modulator.

Therefore, no tuning of the noise shaping coefficients is necessary for operating in various frequency ranges as the normalized center frequency is fixed and. at the same time, the normalized loop delay is in a predetermined range. Only the center frequency of the subfilters needs to be tuned.

Moreover the adjustment method works for all configurations of ΣΔ modulator: with either single bit or multi bit quantizer, with all types of DAC (Digital-to-Analog Converter), with all types of loop filter (active-RC, gm—C, or LC filters, low-pass loop filter, band-pass loop filter, . . . ), w ith all types of sampling techniques, oversampling, sub-sampling, etc.

As a practical consequence, the proposed ΣΔ modulator provides better performance regarding power consumption. For example, when the ΣΔ modulator is manufactured using 65 nm CMOS (Complementary Metal Oxide Semiconductor) technology, it consumes 16 mW from a 1.2V supply with a center frequency ranging from 7 GHz to 9 GHz. More generally, with a CMOS implementation, a power consumption of a few tens of milliwatts and a center frequency up to 9 GHz may be achieved.

Further embodiments of the ΣΔ modulator according to the first aspect are disclosed in the following description.

According to a second aspect, there is provided an Analog-to-Digital converter comprising a ΣΔ modulator according to any embodiment of the present disclosure.

According to a third aspect, there is provided a method for converting an analog input signal having a frequency bandwidth around a variable center frequency $f_0$ to a digital output signal at a sampling frequency $f_s$ by a Sigma-Delta (ΣΔ) modulator. The ΣΔ modulator comprises a quantizer and a loop filter for shaping the quantization noise. The loop filter comprising at least one subfilter centered around frequency $f_0$ and noise shaping coefficients. The method comprises processing by the ΣΔ modulator said analog input signal for generating said digital output signal, the processing being performed using constant noise shaping coefficients which are independent of the center frequency $f_0$. The ΣΔ modulator further comprises a tunable delay element. The method further comprises adjusting the sampling frequency $f_s$ such that the normalized center frequency $f_0/f_s$ is constant; and adjusting the loop delay $t_d$ implemented by the quantizer and the tunable delay clement, such that the normalized loop delay $t_d/T_s$ falls in a predetermined range $[t_{min}, t_{max}]$, where $T_s=1/f_s$. The method may be performed using any ΣΔ modulator according to the present disclosure.

Other aspects of the ΣΔ modulator and method will be apparent from the following description and the appended claims.

BRIEF DESCRIPTION OF THE DRAWINGS

Other advantages and characteristics of the disclosed devices and methods will become apparent from reading the description, illustrated by the following figures, in which like reference numerals refer to similar elements.

DETAILED DESCRIPTION

Several embodiments of a ΣΔ ADC will be described in detail by reference to the figures.

Figure 4:
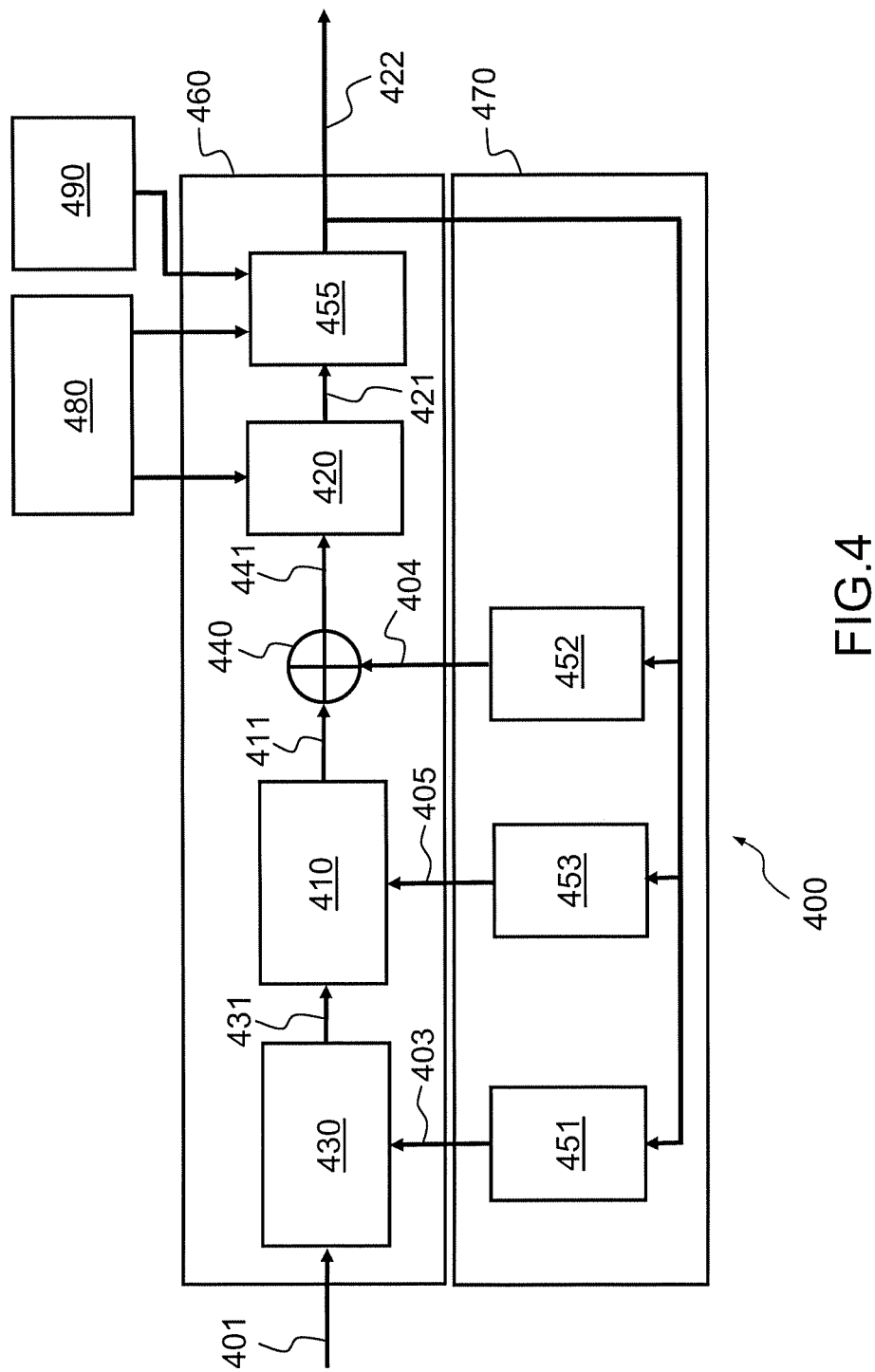
FIG. 4 is a schematic representation of an embodiment of a tunable ΣΔ modulator according to the present disclosure.

FIG. 4 is a schematic representation of an embodiment of a ΣΔ ADC 400 according to the present disclosure. The ΣΔ

Figure 1:
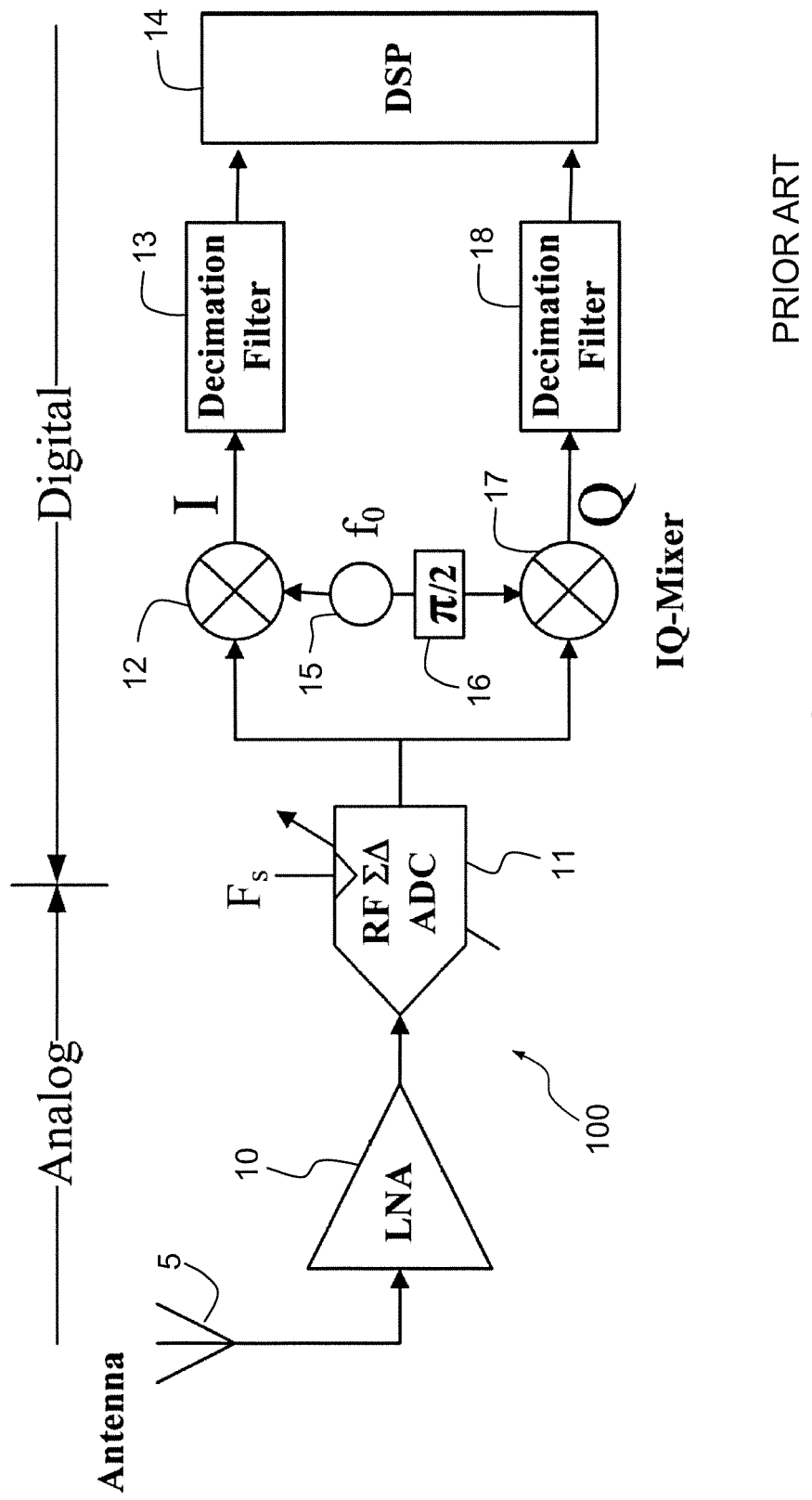
FIG. 1, already described, is a schematic representation of an embodiment of a highly digitized RF receiver.
Figure 2:
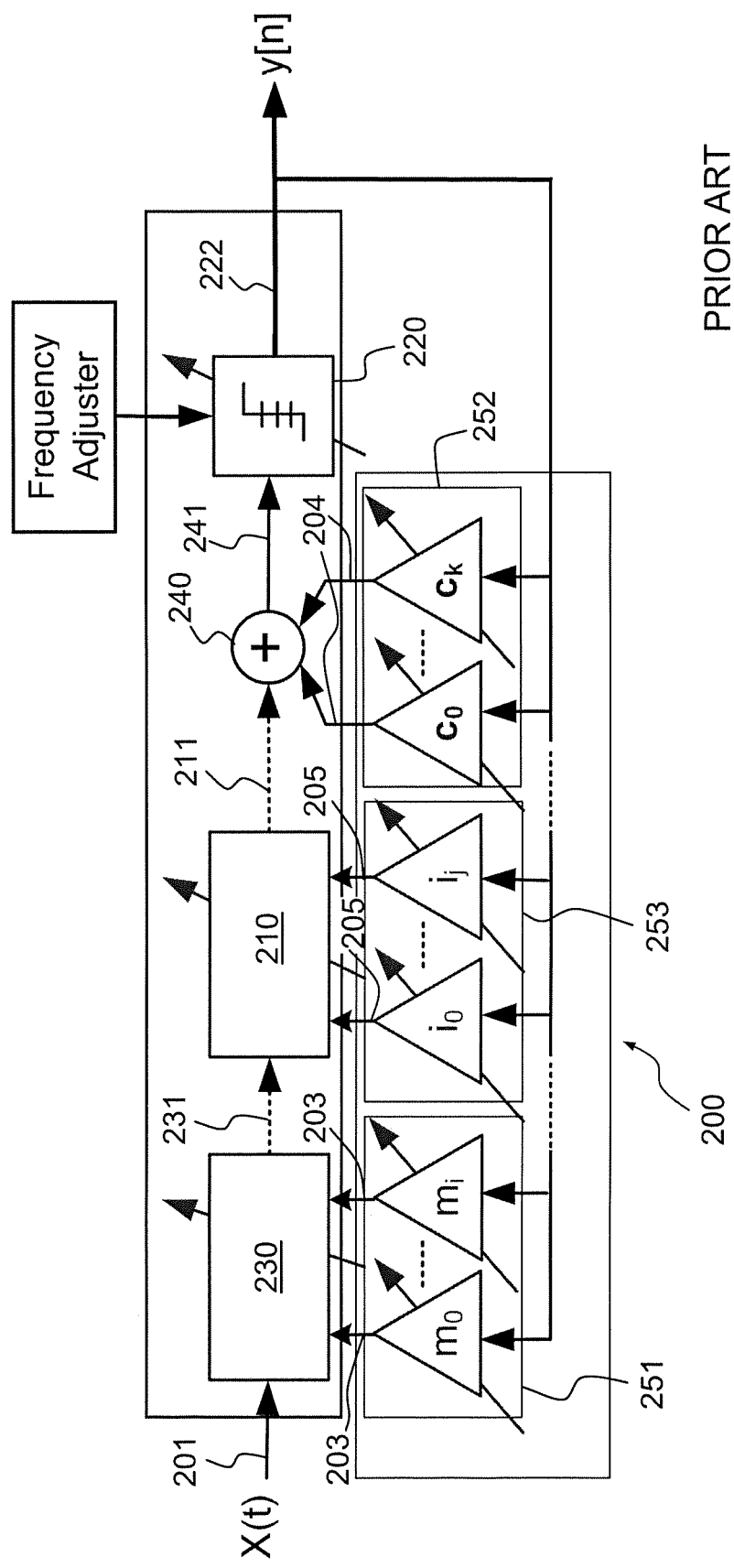
FIG. 2, already described, is a schematic representation of an embodiment of a tunable ΣΔ modulator.
Figure 3A:
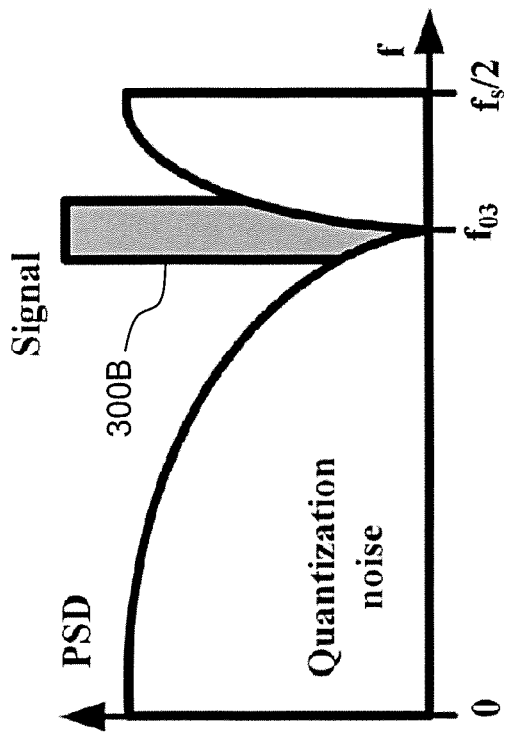
FIG. 3A-3C, already described, represent curves of quantization noise at different center frequencies for an embodiment of a tunable ΣΔ modulator according to the prior art.
Figure 3B:
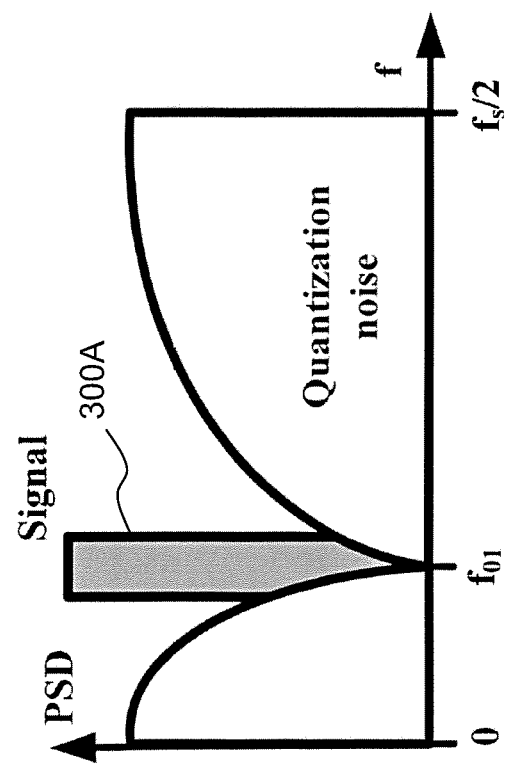
Figure 3C:
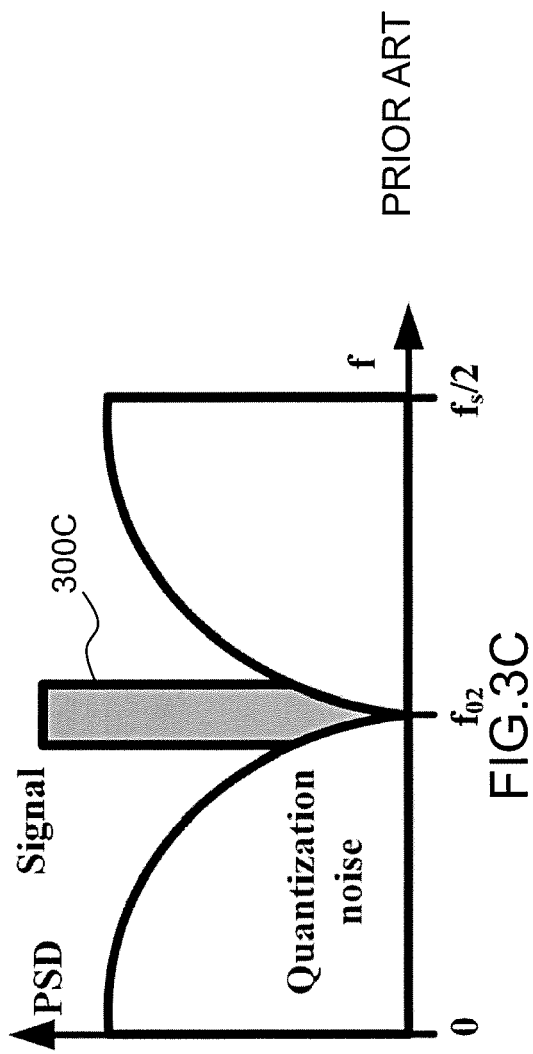

ADC 400 converts an analog input signal 401 having a frequency bandwidth around a variable center frequency $f_0$ to a digital output signal 422 at a sampling frequency $f_s$. The $\Sigma\Delta$ ADC 400 is a circuit that comprises a loop including a forward path 460 for generating the digital output signals 421 and 422 from the analog input signal 401 and a feedback path 470 for generating from the delayed digital output signal 422 one or more feedback signals 403, 404, 405 feeding the forward path. The $\Sigma\Delta$ ADC 400 may be used for implementing the ADC 11 of a RF receiver 100 described by reference to FIG. 1.

The loop comprises a loop filter including one or more subfilters 410, a tunable delay element 455 and one or more DACs 451, 452. In the embodiment illustrated by FIG. 4, the forward path 460 comprises a first subfilter 430, a second subfilter 410, an adder 440, a quantizer 420 and a tunable delay element 455. The quantizer 420 comprises a comparator (for example, an edge-triggered D-Flip-Flop) and one or more latches (not represented). The first subfilter 430 generates a signal 431 from the analog input signal 401 and the feedback signal 403. The second subfilter 410 generates a signal 411 from the analog signal 431 and the feedback signal 405. The adder 440 generates a difference signal 441 as the difference between the filtered signal 411 and the feedback signal 404. The quantizer 420 generates from the difference signal 441 a first digital signal 421 at the sampling frequency $f_s$. The second digital output signal 422 is a delayed version of the digital signal 421.

The loop delay, $t_d$, is here defined as the sum of the fixed time delay, $t_q$, introduced by the quantizer 420 and the variable time delay $t_{var}$ introduced by the tunable delay element 455. The order of the $\Sigma\Delta$ loop filter can be increased by adding more subfilters between the subfilter 410 and the adder 440.

The feedback path further comprises the DACs 451, 452, 453 used to convert the digital output signal 422 to the analog domain before feeding the forward path. The DACs 451, 452, 453 generate the feedback signals 403, 404, 405 respectively. The coefficients of the filters of the DACs 451, 452, 453 are noise-shaping coefficients for shaping the quantification noise. The noise-shaping coefficients are constant. More precisely the noise-shaping coefficients are independent of the center frequency and therefore do not change when the center frequency varies. The transfer function of the loop filter depends on the transfer functions of the subfilter(s) 410, 430, the tunable delay element 455 and the DACs 451, 452, 453.

The $\Sigma\Delta$ ADC 400 further comprises a frequency adjuster 480 for adjusting the sampling frequency $f_s$ of the quantizer 420 as a function of the center frequency $f_0$. In one or more embodiments, the frequency adjuster 480 is implemented by using a PLL (Phase Locked Loop).

In one or more embodiments, the frequency adjuster 480 is configured to adjust the sampling frequency $f_s$ such that the normalized center frequency $f_s/f_0$ is constant and equal to a predetermined value. More precisely, for a given $\Sigma\Delta$ ADC, the normalized center frequency $f_s/f_0$ is fixed to a predetermined value which is independent of the center frequency $f_0$ and therefore does not change when the center frequency varies. Or, to say it another way, the sampling frequency $f_s$ is a linear function of the center frequency $f_0$.

In one or more embodiments, the normalized center frequency $f_s/f_0$ is equal to 4. Using a normalized center frequency equal to 4 enables to reduce the complexity of the digital part of an RF receiver 100 represented on FIG. 1. In fact, when sampling a sinusoidal wave $w(t)=\sin(2\pi f_0 t)$ of frequency $f_0$ at a sampling frequency $f_s$ equal to $f_s=4f_0$ generates 4 samples at $t=0$, $1/f_s$, $2/f_s$, $3/f_s$ corresponding respectively to $w(0)=0$; $w(1/fs)=w(\pi/2)=1$; $w(2/fs)=w(\pi)=0$; and $w(3/fs)=w(3\pi/2)=-1$. The 4 samples may thus be coded on a low number of bits, e.g. on 1 bit. The decimation filters 13 and 18 may thus be simplified accordingly.

In one or more embodiments, the center frequencies of the subfilters 410 are tuned to the desired center frequency $f_0$ of the ADC. These subfilters may comprise active resonators based on operational amplifier(s) or LC-based passive resonators. In one or more embodiments, the normalized center frequency, $f_s/f_0$, and the normalized loop delay, $td/Ts$, are kept constant. This is achieved by adjusting the sampling frequency, $f_s$, using the frequency adjuster 480, and by adjusting the loop delay, td, using the delay adjuster 490. The noise shaping coefficients are constant. In FIG. 4, we show one technique to realize the noise-shaping coefficients using the feedback DACs 451, 452, 453. These DACs are usually realized using a switched current source where the value of the current source determines the value of the noise-shaping coefficient. The noise-shaping coefficients may also be realized using FIRDACs, feedforward coefficients or a combination of all these techniques.

While FIG. 4 illustrates an example of an embodiment of a $\Sigma\Delta$ ADC with the tunable delay element in the forward path, the tunable delay element may be in the forward path and/or in the feedback path.

Figure 5:
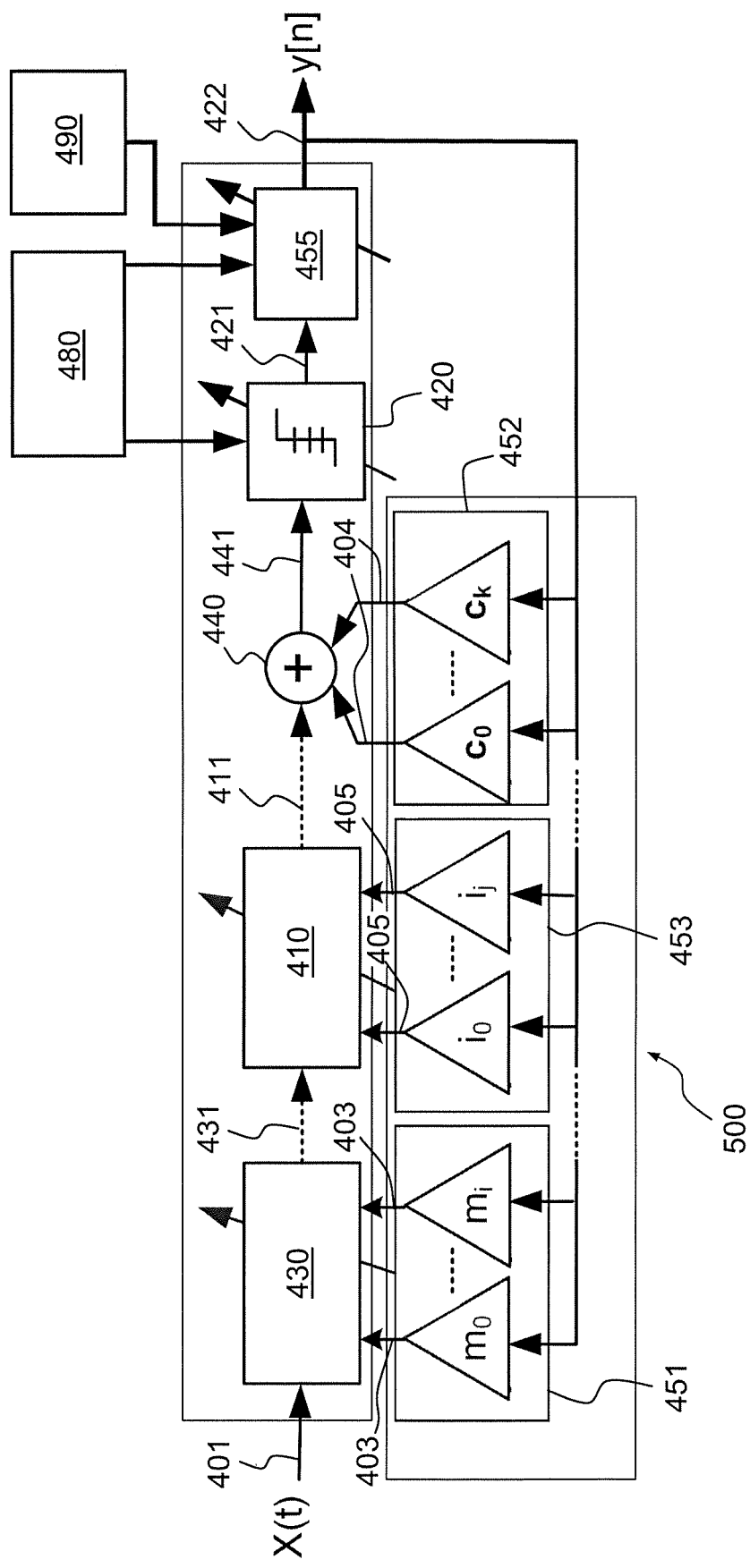
FIG. 5 is a schematic representation of an embodiment of a tunable ΣΔ modulator according to the present disclosure.

FIG. 5 is a schematic representation of an embodiment of a $\Sigma\Delta$ ADC 500 according to the present disclosure. The $\Sigma\Delta$ ADC 500 includes elements that are identical or similar to those of the $\Sigma\Delta$ ADC 400 of FIG. 4 and are identified by the same reference numbers: these elements will not be described again. Only additional details or differences will be described. The loop filter of the $\Sigma\Delta$ ADC 500 comprises one or more subfilters 410, 430, a tunable delay element 455 and one or more DACs 451, 452, 453.

The subfilter 430 may include a resonator and an adder for generating a difference signal from the analog input signal 401 and the feedback signal 403. The subfilter 430 generates a filtered signal 431.

The subfilter 410 may include a resonator and an adder for generating a difference signal from the filtered signal 431 and the feedback signal 405. The subfilter 410 generates a filtered signal 411.

The DAC 451 generates the feedback signal 403 for feeding the subfilter 430. In the embodiment represented on FIG. 5, the DAC 451 has one or more noise shaping coefficients $m_0$ to $m_i$.

The DAC 453 generates the feedback signal 405 for feeding the subfilter 410. In the embodiment represented on FIG. 5, the DAC 453 has one or more noise shaping coefficients $i_0$ to $i_j$.

The DAC 452 generates the feedback signal 404 for the adder 440. In the embodiment represented on FIG. 5, the DAC 452 has one or more noise shaping coefficients $c_0$ to $c_k$.

While FIG. 5 shows an example of an embodiment of a $\Sigma\Delta$ ADC with noise shaping coefficients in the feedback path, the noise shaping coefficients may be implemented in the forward path and/or in the feedback path.

Figure 6:
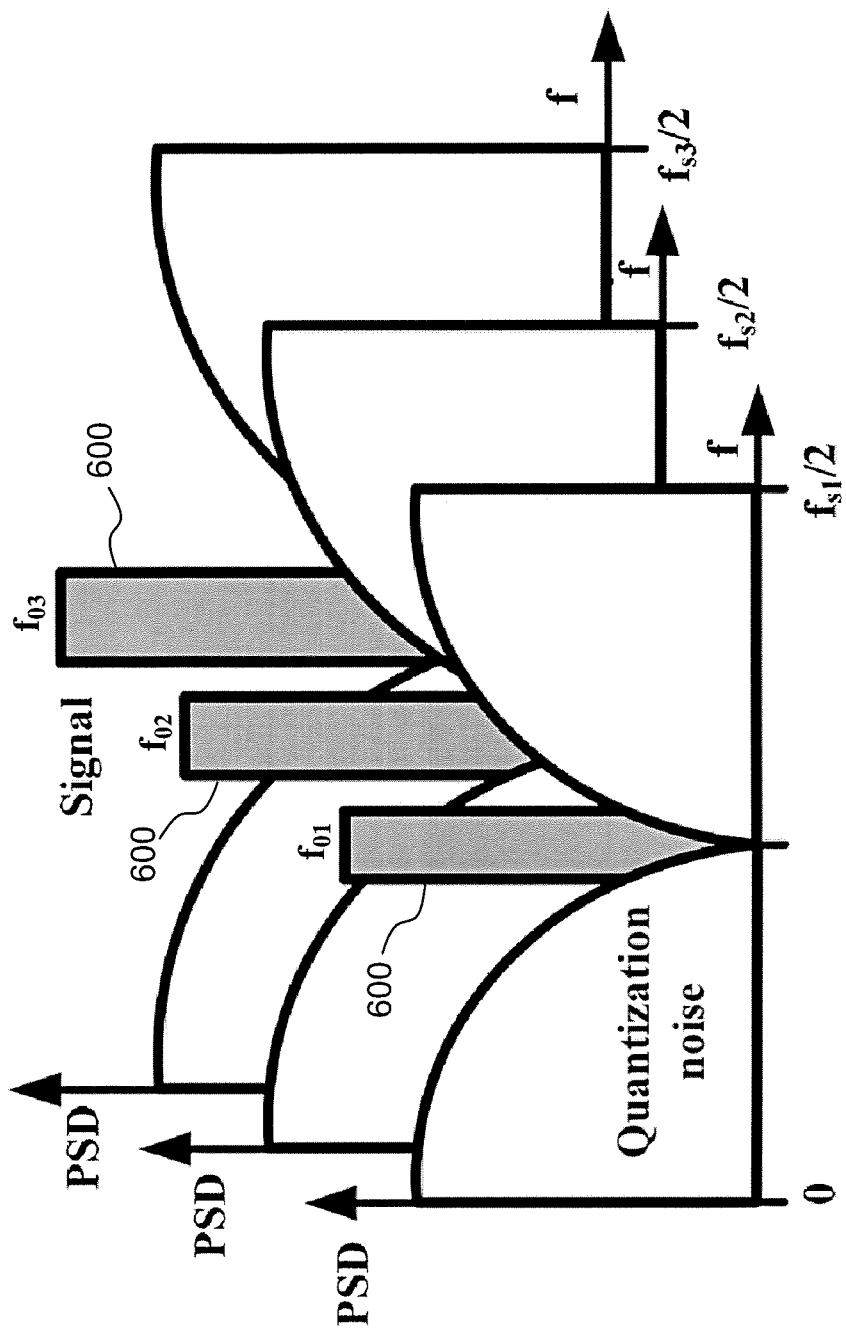
FIG. 6 represent curves of quantization noise of a tunable ΣΔ modulator according to the present disclosure.

FIG. 6 illustrates the shape of power spectral density (PSD) curve of the quantization noise as a function of the input signal frequency. The desired frequency band 600 of the analog input signal 401 is assumed to be centered around the center frequency $f_{01}$ equal to $f_s/4$. Those curves illustrate the fact, that when the normalized center frequency is constant, i.e. fixed to a predetermined value, the shape of the power spectral density (PSD) of the quantization noise is also constant. As a consequence, the noise shaping coefficients of ΣΔ ADC are constant. These noise shaping coefficients are constant whether they are implemented in the feedforward or in the feedback path. These noise shaping coefficients need not to be adjusted when the center frequency $f_0$ varies. However the center frequencies of the subfilters 430, 410 still need to be adjusted to desired frequency band 600. As an example, referring back to FIG. 5, for a desired center frequency, the center frequencies of the subfilters 430, 410 and the sampling frequency, fs, are adjusted using the frequency adjuster 480, and the loop delay, td, is adjusted using the delay adjuster 490 but the noise shaping coefficients $m_0$ to $m_i$, $i_0$ to $i_j$, $c_0$ to $c_k$, implemented, in this embodiment, by the feedback DACs 451, 453, 452 are constant.

The tunable delay element 455 is an adjustable delay. In one or more embodiments, the ΣΔ ADC 400 further comprises a delay adjuster 490 for adjusting the loop delay $t_d$ of the loop of the ΣΔ ADC 400. The loop delay, $t_d$, is here defined as the sum of the fixed time delay, $t_q$, introduced by the quantizer 420 and the variable time delay $t_{var}$ introduced by the tunable delay element 455.

In one or more embodiment, the loop delay, $t_d$, is adjusted as a function of the sampling frequency, $f_s$, such that the normalized loop delay, $t_d/T_s$, falls in a predetermined range $Rd=[t_{min}, t_{max}]$, where $T_s=1/f_s$. The predetermined range $Rd=[t_{min}, t_{max}]$ may be such that $t_{min}=t_{max}$, thus keeping the normalized loop delay, $t_d/T_s$ fixed.

The adjustment of the loop delay, $t_d$, may be performed in different ways. In one or more embodiments, the tunable delay element 455 is a programmable delay and the delay adjuster is a circuit for programming the programmable delay.

The document entitled "A Low Power Tunable Delay Element Suitable for Asynchronous Delays of Burst Information", by Schell et al, IEEE JOURNAL OF SOLID-STATE CIRCUITS, VOL. 43, NO. 5, MAY 2008, describes embodiments of a tunable delay element suitable for implementing the tunable delay element 455 of the ΣΔ ADC 400. The technique proposed in this paper is rather complex and requires a large area and power consumption. In the following, we propose a simple technique to adjust the loop delay so that the normalized loop delay falls within a predetermined range where the SNR degradation is insignificant.

In one or more embodiments, the quantizer 420 and the tunable delay element 455 comprises a plurality of cascaded latches.

Figure 7:
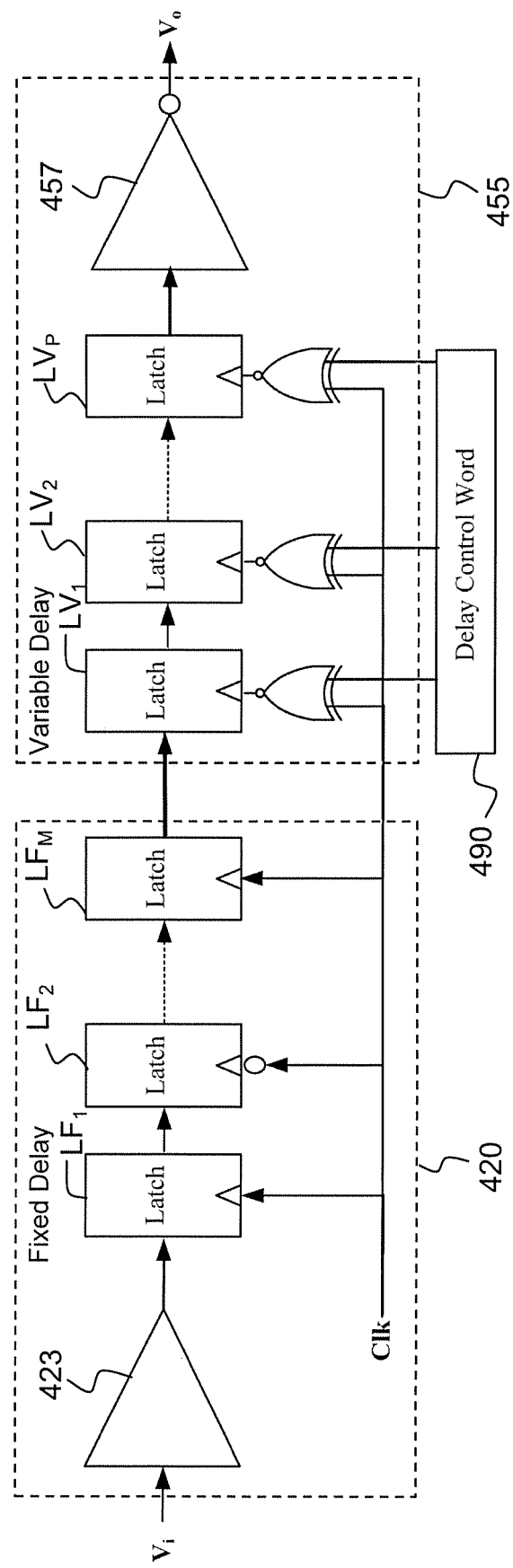
FIG. 7 is a schematic representation of an embodiment of the quantizer and the tunable delay element.

FIG. 7 illustrates embodiments of the quantizer 420 and the tunable delay element 455 using cascaded latches.

In one or more embodiments, the quantizer 420 comprises a preamplifier 423 followed by a fixed number M of cascaded latches $LF_1$, $LF_2$, ..., $LF_M$, connected in series, and clocked by a clock signal at frequency $f_s$. The clock signal clk used for controlling the latches ($LF_1$-$LF_M$) is the sampling signal at frequency $f_s$.

The delay $t_q=(M-1)(Ts/2)$ implemented by the quantizer 420 is a fixed multiple of half the sampling period. Cascaded latches ($LF_1$-$LF_M$) of the quantizer are successively toggled clocked to the one another. For example, if the quantizer 420 comprises M=3 latches $LF_1$, $LF_2$, $LF_3$, then the latches $LF_1$ and $LF_3$ are controlled by the clock signal while the latch $LF_2$ is controlled by the inversed clock signal.

In one or more embodiments, the tunable delay element 455 comprises a plurality of P cascaded latches $LV_1$, $LV_2$, ..., $LV_P$, connected in series followed by an inverter 457. The latches ($LV_1$-$LV_P$) are clocked by a clock signal at frequency $f_s$. The clock signal clk used for controlling the latches ($LV_1$-$LV_P$) is the sampling signal at frequencyf, The delay $t_{var}=P(Ts/2)$ implemented by the tunable delay element 455 is variable multiple of half the sampling period. The cascaded latches ($LV_1$-$LV_P$) of the tunable delay element 455 may be either identically clocked or toggle clocked. Two cascaded latches having toggled clock have a half clock cycle (Ts/2) as delay. On the other hand, two cascaded latches having identical clock has theoretically zero delay.

Each latch of the plurality of latches $LV_1$-$LV_P$ receives a control signal clk which is either the clock signal or the inversed clock signal. By alternating from one latch $LV_i$ to the next one $LV_{i+1}$ in the series the selection of the clock signal, the delay $t_i$ implemented by each latch of the tunable delay element 455 is equal to half of the sampling period $T_s/2=1/2f_s$. The time delay $t_{var}$ implemented by the tunable delay element 455 is thus equal to P (Ts/2).

On the contrary, by feeding the latches only with the clock signal, the delay $t_i$ implemented by each latch of the tunable delay element 455 is (theoretically) equal to zero. The time delay $t_{var}$ implemented by the tunable delay element 455 is thus equal 0.

The time delay $t_{var}$ implemented by the tunable delay element 455 may thus be adjusted between $t_{var1}=0$ and $t_{var2}=P(Ts/2)$ by selectively sending either the clock signal or the inversed clock signal to each latch $LV_1$, $LV_2$, ..., $LV_P$. For example, if P=4 toggled latches are implemented, the time delay $t_{var}$ may be adjusted between $t_{var1}0$ and $t_{b2}=2T_s$.

The delay adjuster 490 is configured to send to each latch of the plurality of latches $LV_1$, $LV_2$, ..., $LV_P$ a control signal which is either the clock signal or the inversed clock signal. Unlike the latches of the quantizer 420, the clock signal used for controlling the latches $LV_1$ to $LV_P$ of the tunable delay element 455 may vary upon time, in particular with the sampling frequency $f_s$ and the center frequency $f_0$.

In one or more embodiments, the number of toggled latches in the tunable delay element 455 may be adjusted in order to get a ΣΔ ADC 400 usable for other frequencies ranges.

According to the embodiment of FIG. 7, the loop delay $t_d$ of the ΣΔ ADC 400 is implemented by a series of N=M+P toggled latches of the quantizer 420 and the tunable delay element 455. The maximum loop delay $t_d$ is in theory:

$$t_{dmax}=(N-1)T_s/2.$$

In practical implementation, the loop delay $t_d$ of ΣΔ ADC 400 is $$t_{dmax}=(N-1)T_s/2+t_\varepsilon$$

where $t_\varepsilon=t_{reg}+t_{inverter}+t_{DAC}$, where $t_{reg}$ is the regeneration time of the last latch of the tunable delay element 455, $t_{inverter}$ is the time delay due to the inverter 457 of the tunable delay element 455 and $t_{DAC}$ is the time delay of the Digital-to-Analog converters 451, 452, 453 in the feedback path.

The normalized loop delay is thus:

$$t_d/Ts=(N-1)/2+t_\varepsilon/Ts$$

While the first part of the normalized loop delay (N−1)/2 is well-defined, independent of the sampling period Ts and independent of process parameters, the other part $t_\varepsilon/Ts$ is generally uncontrollable, dependent on the sampling period Ts.

Figure 8:
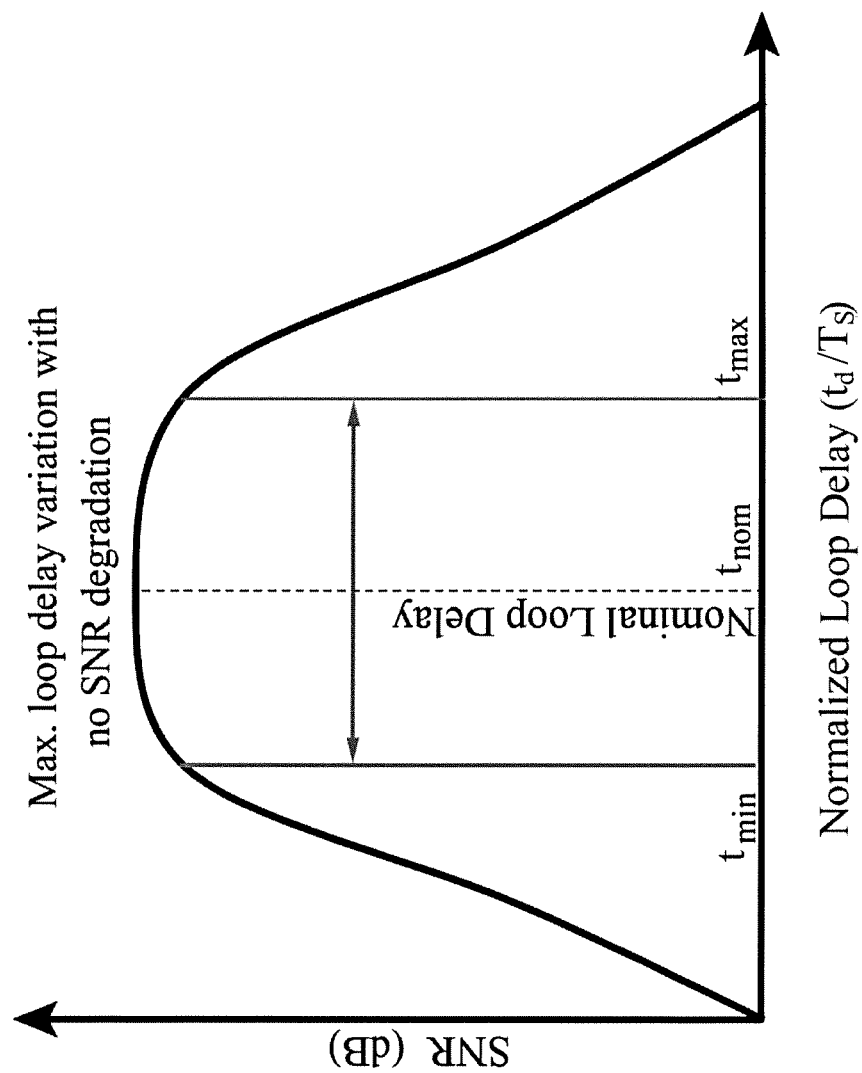
FIG. 8 is a curve that illustrates the Signal-to-Noise Ratio degradation of a ΣΔ modulator with respect to the normalized loop delay.

FIG. 8 shows a curve that illustrates the variations of Signal-to-Noise Ratio (SNR) of an ΣΔ ADC 500 as a function of the normalized loop delay $t_d/T_s$. This curve results from simulations performed for a given ΣΔ architecture and sampling frequency $f_s$. As can be seen from the shape of this curve, there is no or little SNR degradation when the normalized loop delay $t_d/T_s$ is in the range $R_d = [t_{min}, t_{max}]$ around a nominal loop delay $t_{nom}$. In one or more embodiment, the range $Rd = [t_{min}, t_{max}]$ is equal to [1.2; 1.7] and $t_{nom} = 1.5$. In order to compensate for the variations of the normalized loop delay, the time delay $t_{var}$ of the tunable delay element 455 may be adjusted so that the normalized loop delay of the ΣΔ ADC 500 is maintained within the range $Rd = [t_{min}, t_{max}] = [1.2; 1.7]$. Accordingly, the ΣΔ ADC 500 achieves the same SNR when the loop delay $t_d$ varies between 1.2 Ts and 1.7 Ts.

Figure 9:
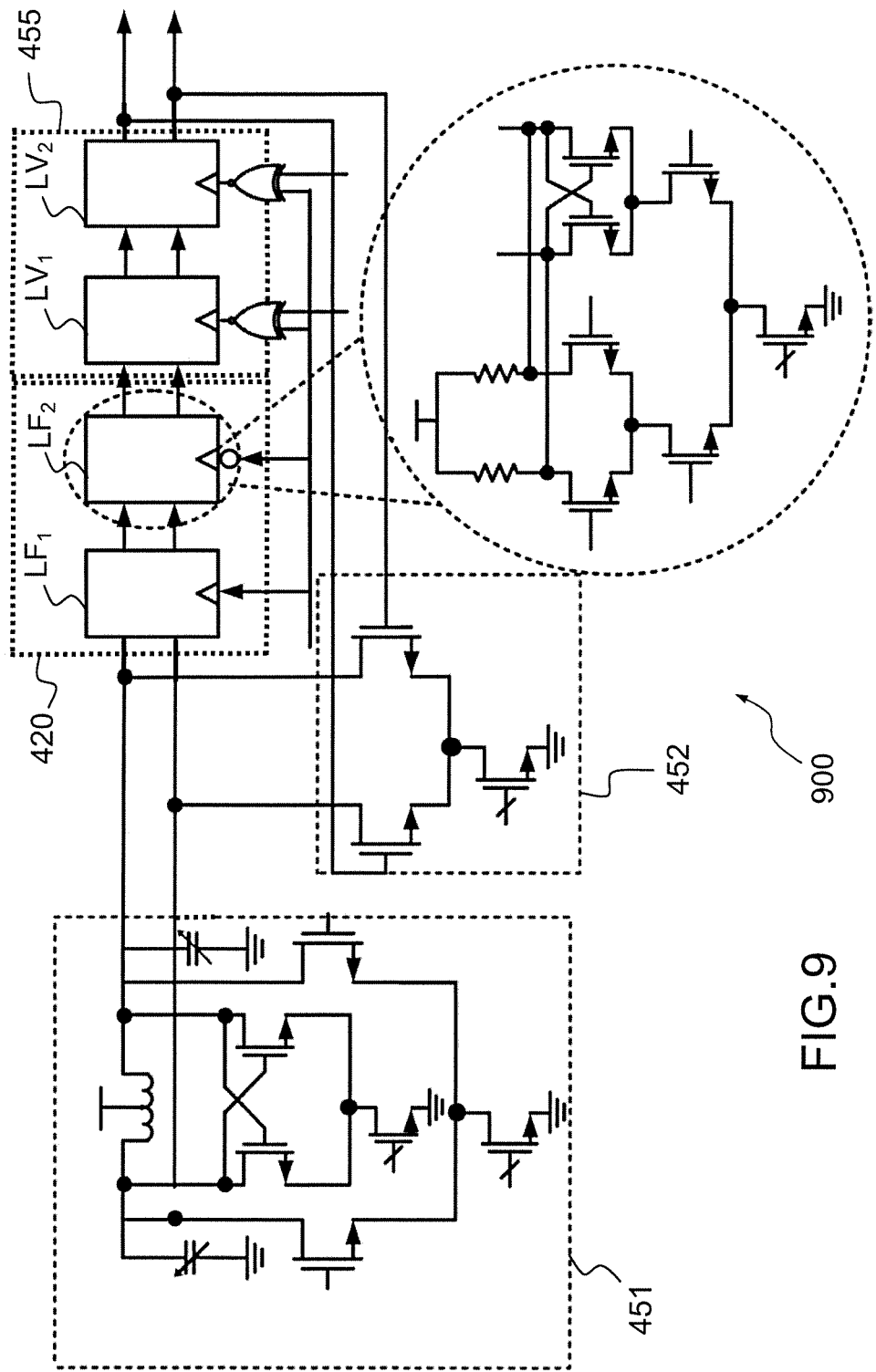
FIG. 9 is a schematic representation of an embodiment of a tunable ΣΔ modulator according to the present disclosure.

FIG. 9 is a schematic representation of an embodiment of a ΣΔ ADC 900 according to the present disclosure. This embodiment may be performed using CMOS technology. The overall ΣΔ design is optimized for the nominal loop delay $t_{nom}$. The reported ΣΔ ADC is optimized and its noise shaping coefficients are calculated for a loop filter with a nominal loop delay $t_{nom} = 1.5$ Ts. As illustrated by FIG. 9, the number of noise shaping coefficients of the DAC 452 may be reduced to a single feedback coefficient. The ΣΔ ADC 900 may be composed of an LC filter 451, a single bit comparator 420, a tunable delay element 455 and a Non-Return-to-Zero (NRZ) feedback DAC 452. The LC filter 451 may be composed of an input transconductance, Gin and an LC tank. The input transconductance Gin converts the input voltage to current enabling current summation at the feedback node. The LC tank is composed of a differential inductor, two capacitor banks and a negative transconductance, Gmq.

The table below illustrates how the normalized loop delay varies with the sampling frequency $f_s$ depending on the total number N=P+M of latches that is used in the quantizer 420 and in the tunable delay element 455 of the ΣΔ ADC 500. In this table, M=2, P=2 and N=P+M=4. The number of toggled latches varies from M=2 to N=4.

| Sampling Frequency (GHz) | Normalized loop delay | | |
|---|---|---|---|
| | 2 Latches*** | 3 Latches** | 4 Latches* |
| 2.0 | 0.7 | 1.2 | 1.7 |
| 3.0 | 0.8 | 1.3 | 1.8 |
| 4.0 | 0.9 | 1.4 | 1.9 |
| 5.0 | 1.0 | 1.5 | 2.0 |
| 6.0 | 1.1 | 1.5 | 2.1 |
| 7.0 | 1.2 | 1.7 | 2.2 |
| 8.0 | 1.3 | 1.8 | 2.3 |
| 9.0 | 1.4 | 1.9 | 2.4 |
| 10.0 | 1.5 | 2.0 | 2.5 |
| 11.0 | 1.6 | 2.1 | 2.6 |
| 12.0 | 1.7 | 2.2 | 2.7 |

*all consecutive latches are toggled
**the last 2 latches are not toggled
***the last 3 latches are not toggled In order to reach high sampling frequencies in the GHz range these latches are implemented using the Source Coupled Logic (SCL) technique. In the case of 2 latches, the normalized loop delay $t_d/T_s$ is within the range $Rd = [t_{min}, t_{max}] = [1.2; 1.7]$ when the sampling frequency is between 7 GHz and 12 GHz. In this case, the normalized loop delay $t_d/T_s$ is lower than $t_{min}$ when the sampling frequency is below 7 GHz. In the case of 3 latches, the normalized loop delay $t_d/T_s$ is within the range $Rd = [t_{min}, t_{max}] = [1,2; 1,7]$ when the frequency is between 2 GHz and 7 GHz and higher than $t_{max}$ when the sampling frequency is above 7 GHz. With 4 latches, the normalized loop delay $t_d/T_s$ is within the range $Rd = [t_{min}, t_{max}] = [1,2; 1,7]$ when the frequency is 2 GHz. In this case, the normalized loop delay $t_d/T_s$ is higher than $t_{max}$ when the sampling frequency is above 2 GHz.

This table illustrates the fact that the adjustment of loop delay may be performed so that the normalized loop delay falls within the appropriate range $Rd = [t_{min}, t_{max}] = [1.2; 1.7]$. The adjustment of the normalized loop delay may be performed by adjusting the time delay $t_{var}$ of the tunable delay element 455. The adjustment may b performed so that the SNR degradation is below a given threshold.

In one or more embodiments, the delay adjuster 490 is configured to adjust the delay $t_{var}$ of the tunable delay element 455 to a predetermined number of half of a clock period of the clock signal. The number of latches that is used is dependent on the desired range for sampling frequency $f_s$. For example, the number of latches is equal to N=4 with M=2 latches in the quantizer 420 and P=2 latches in the tunable delay element 455 so as to cover the range of sampling frequency from 2 GHz to 12 GHz. For a selected number of latches, the normalized loop delay may further be adjusted are described previously.

Figure 10:
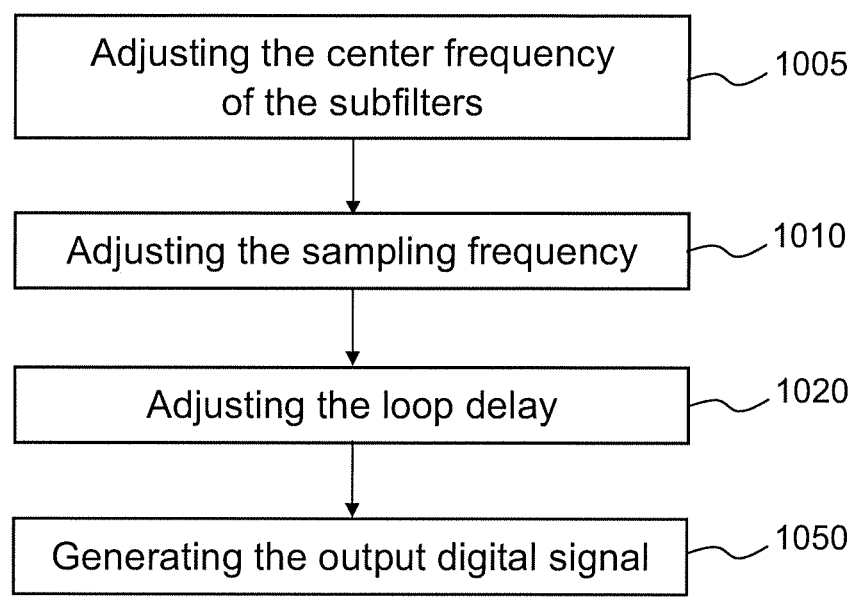
FIG. 10 is a flowchart of an embodiment of a method according to the present disclosure.

FIG. 10 shows the steps of an embodiment of a method for converting an analog input signal having a radiofrequency bandwidth around a variable center frequency $f_0$ to a digital output signal at a sampling frequency $f_s$. The conversion is implemented by a Sigma-Delta (ΣΔ) modulator according to the present disclosure. The ΣΔ modulator comprises a loop with a forward path and a feedback path. The loop comprises a quantizer and a loop filter. The loop filter comprises one or several subfilters centered around frequency $f_0$, a tunable delay element 455 and noise shaping coefficients that may be in the forward path or in the feedback path. While the various steps in these flowcharts are presented and described sequentially, some or all of the steps may be executed in different orders, may be combined or omitted, and some or all of the steps may be executed in parallel.

In one or more embodiment the method comprises a step 1005 of adjusting the center frequency $f_0$ of the subfilters. The adjustment is usually performed by a digital control signal.

In one or more embodiment the method comprises a step 1010 of adjusting the sampling frequency $f_s$ such that the normalized center frequency $f_0/f_s$ is constant.

In one or more embodiment the method comprises a step 1020 of adjusting the loop delay $t_d$ implemented by the quantizer (420) and the tunable delay element (455), such that the normalized loop delay $t_d/T_s$ falls within a predetermined range $[t_{min}, t_{max}]$, where $T_s = 1/f_s$. The adjustment may be performed according to the embodiments described by reference to FIG. 7 or 9.

The method further comprises a step 1050 of generating by the loop filter the digital output signal from the analog input signal. The noise shaping coefficients of the loop filter are constant and independent of the center frequency $f_0$. The step 150 may include a step of generating a difference signal from the analog input signal and a feedback signal generated by the feedback path; a step of filtering the difference signal by at least one subfilter and a step of generating the digital output signal by the quantizer.

In one or more embodiment the filtering is performed by at least one subfilter having a transfer function with a tunable center frequency $f_0$.

Although described by way of a number of detailed example embodiments, the Sigma-Delta modulator according to the present description comprises various variants, modifications and improvements that will be obvious to those skilled in the art. It is understood that these various variants, modifications and improvements fall within the scope of the disclosed devices or methods such as defined by the following claims.

The invention claimed is:

1. A Sigma-Delta (ΣΔ) modulator for converting an analog input signal having a frequency bandwidth around a variable center frequency $f_0$ to a digital output signal at a sampling frequency $f_s$, the ΣΔ modulator comprising
   a quantizer for generating the digital output signal,
   a loop filter for shaping the quantization noise, the loop filter comprising
      at least one subfilter centered around a frequency $f_0$, and
      noise shaping coefficients,
   the ΣΔ modulator being characterized in that:
      the noise shaping coefficients are constant and independent of the center frequency $f_0$;
      the ΣΔ modulator further comprises
         a tunable delay element;
         a frequency adjuster for adjusting the sampling frequency $f_s$ such that the normalized center frequency $f_0/f_s$ is constant;
         a delay adjuster for adjusting the loop delay $t_d$ implemented by the quantizer and the tunable delay element, such that the normalized loop delay $t_d/T_s$ falls in a predetermined range $[t_{min}, t_{max}]$, where $T_s = 1/f_s$.

2. The ΣΔ modulator according to claim 1, wherein the predetermined range $[t_{min}, t_{max}]$ is independent on the center frequency $f_0$ and the loop delay $t_d$ is adjusted to a value that is a function of the center frequency $f_0$ and the sampling frequency $f_s$.

3. The ΣΔ modulator according to claim 1, wherein $t_{min} = t_{max}$.

4. The ΣΔ modulator according to claim 1, wherein the tunable delay element comprises a plurality of cascaded latches and the delay adjuster is configured to adjust the loop delay $t_d$ to a number of half of a clock period of a clock signal controlling the plurality of cascaded latches.

5. The ΣΔ modulator according to claim 4, the delay adjuster is configured to send to each latch of the plurality of cascaded latches a clock signal selected from the group comprising the clock signal and the inversed clock signal.

6. The ΣΔ modulator according to claim 1, wherein the tunable delay element is a programmable delay element and delay adjuster is a circuit for programming the programmable delay.

7. A Sigma-Delta Analog-to-Digital converter (ΣΔ ADC) comprising a Sigma-Delta modulator according to claim 1.

8. A telecommunication device comprising a radio interface for receiving a radio signal and an Analog-to-Digital converter according to claim 7 for converting the radio signal to a digital signal.

9. A method for converting an analog input signal having a frequency bandwidth around a variable center frequency $f_0$ to a digital output signal at a sampling frequency $f_s$ by a Sigma-Delta (ΣΔ) modulator, the ΣΔ modulator comprising a quantizer and a loop filter for shaping the quantization noise, the loop filter comprising at least one subfilter centered around frequency $f_0$ and noise shaping coefficients,
   the method comprising,
      processing by the ΣΔ modulator said analog input signal for generating said digital output signal,
      the method being characterized in that:
         the processing is performed using constant noise shaping coefficients which are independent of the center frequency $f_0$;
         the ΣΔ modulator further comprises a tunable delay element;
      and in that the method further comprises:
         adjusting the sampling frequency $f_s$ such that the normalized center frequency $f_0/f_s$ is constant,
         adjusting the loop delay $t_d$ implemented by the quantizer and the tunable delay element, such that the normalized loop delay $t_d/T_s$ falls in a predetermined range $[t_{min}, t_{max}]$, where $T_s = 1/f_s$.

10. The method according to claim 9, wherein $t_{min} = t_{max}$.

11. The ΣΔ modulator according to claim 2, wherein $t_{min} = t_{max}$.

12. The ΣΔ modulator according to claim 2, wherein the tunable delay element comprises a plurality of cascaded latches and the delay adjuster is configured to adjust the loop delay $t_d$ to a number of half of a clock period of a clock signal controlling the plurality of cascaded latches.

13. The ΣΔ modulator according to claim 3, wherein the tunable delay element comprises a plurality of cascaded latches and the delay adjuster is configured to adjust the loop delay $t_d$ to a number of half of a clock period of a clock signal controlling the plurality of cascaded latches.

14. The ΣΔ modulator according to claim 2, wherein the tunable delay element is a programmable delay element and delay adjuster is a circuit for programming the programmable delay.

15. The ΣΔ modulator according to claim 3, wherein the tunable delay element is a programmable delay element and delay adjuster is a circuit for programming the programmable delay.

16. The ΣΔ modulator according to claim 4, wherein the tunable delay element is a programmable delay element and delay adjuster is a circuit for programming the programmable delay.

17. The ΣΔ modulator according to claim 5, wherein the tunable delay element is a programmable delay element and delay adjuster is a circuit for programming the programmable delay.

18. A Sigma-Delta Analog-to-Digital converter (ΣΔ ADC) comprising a Sigma-Delta modulator according to claim 2.

19. A Sigma-Delta Analog-to-Digital converter (ΣΔ ADC) comprising a Sigma-Delta modulator according to claim 3.

20. A Sigma-Delta Analog-to-Digital converter (ΣΔ ADC) comprising a Sigma-Delta modulator according to claim 4.

* * * * *